United States Patent
Kwon et al.

(10) Patent No.: US 12,308,214 B2
(45) Date of Patent: May 20, 2025

(54) METHOD OF PROCESSING SUBSTRATE

(71) Applicant: TES Co., Ltd, Yongin-si (KR)

(72) Inventors: Bong-Soo Kwon, Yongin-si (KR);
Se-Woong Bae, Yongin-si (KR);
Eun-Jin Song, Yongin-si (KR)

(73) Assignee: TES CO., LTD, Yongin-si (KR)

( * ) Notice: Subject to any disclaimer, the term of this patent is extended or adjusted under 35 U.S.C. 154(b) by 268 days.

(21) Appl. No.: 17/986,147

(22) Filed: Nov. 14, 2022

(65) Prior Publication Data

US 2023/0154731 A1 May 18, 2023

(30) Foreign Application Priority Data

Nov. 12, 2021 (KR) .......................... 10-2021-0155334
Oct. 21, 2022 (KR) .......................... 10-2022-0136823

(51) Int. Cl.
*H01L 21/67* (2006.01)
*H01J 37/32* (2006.01)

(52) U.S. Cl.
CPC .. *H01J 37/32477* (2013.01); *H01J 37/32082* (2013.01); *H01J 37/32357* (2013.01); *H01J 37/32862* (2013.01); *H01J 37/32788* (2013.01); *H01J 2237/3346* (2013.01)

(58) Field of Classification Search
None
See application file for complete search history.

(56) References Cited

U.S. PATENT DOCUMENTS

| | | | | |
|---|---|---|---|---|
| 11,101,138 B2* | 8/2021 | Tomura | ............ | H01L 21/68757 |
| 2013/0023124 A1* | 1/2013 | Nemani | ............ | H01L 21/31138 |
| | | | | 257/E21.271 |
| 2014/0141621 A1* | 5/2014 | Ren | .................... | H01L 21/31116 |
| | | | | 438/724 |
| 2016/0225585 A1* | 8/2016 | Wada | ................. | H01J 37/32834 |
| 2019/0122865 A1* | 4/2019 | Chen | ................. | H01J 37/32422 |
| 2019/0326102 A1* | 10/2019 | Mitsumori | ........ | H01L 21/31116 |
| 2020/0098586 A1* | 3/2020 | Xia | ..................... | H01J 37/32357 |
| 2021/0111033 A1* | 4/2021 | Korolik | ............. | H01J 37/32633 |

(Continued)

FOREIGN PATENT DOCUMENTS

| | | | |
|---|---|---|---|
| JP | 2016-219786 A | | 12/2016 |
| JP | 2020-025070 A | | 2/2020 |
| KR | 10-2008-0027714 A | | 3/2008 |

(Continued)

OTHER PUBLICATIONS

Taiwanese Office Action for related TW Application No. 111142974 mailed Jul. 24, 2023 from Taiwan Intellectual Property Office.

(Continued)

*Primary Examiner* — Shamim Ahmed
(74) *Attorney, Agent, or Firm* — Paratus Law Group, PLLC

(57) ABSTRACT

There is provided a method of processing a substrate comprising an ONO stack in which a silicon oxide layer and a silicon nitride layer are stacked alternately and repeatedly on the substrate. The method includes: (a) primarily dry-etching silicon nitride layers of the ONO stack; (b) producing oxygen radicals and processing silicon oxide layers of the ONO stack with the oxygen radicals; and (c) secondarily dry-etching the silicon nitride layers of the ONO stack.

15 Claims, 2 Drawing Sheets

(56) References Cited

U.S. PATENT DOCUMENTS

2021/0143058 A1* 5/2021 Jha .................... H01L 21/3105

FOREIGN PATENT DOCUMENTS

| KR | 10-2021-0092884 A | 7/2021 |
| KR | 10-2272823 B1 | 7/2021 |
| TW | 201642340 A | 12/2016 |
| TW | 201707047 A | 2/2017 |
| TW | 202032656 A | 9/2020 |

OTHER PUBLICATIONS

Korean Office Action for related KR Application No. 10-2022-0136823 mailed Aug. 12, 2024 from Korean Intellectual Property Office.

* cited by examiner

METHOD OF PROCESSING SUBSTRATE

CROSS-REFERENCE TO RELATED APPLICATIONS

This application claims priority to Korean Patent Application No. 10-2021-0155334 (filed on Nov. 12, 2021) and Korean Patent Application No. 10-2022-0136823 (filed on Oct. 21, 2022), which are all hereby incorporated by reference in their entirety.

BACKGROUND

The present disclosure relates to a method of processing a substrate comprising an oxide-nitride-oxide (ONO) stack where a silicon oxide layer and a silicon nitride layer are stacked alternately and repeatedly on the substrate. Specifically, the present disclosure relates to a method of dry-etching the nitride layers in the ONO stack selectively.

At a time of manufacturing semiconductor elements, an ONO stack is formed in a way that a silicon oxide layer and a silicon nitride layer are stacked alternately and repeatedly on a substrate. To etch the silicon nitride layers in the ONO stack selectively, an etchant having etch selectivity higher than that of the silicon oxide layer needs to be applied.

In the dry etching process, tetrafluoromethane ($CF_4$), nitrogen trifluoride ($NF_3$) and the like can be usually used as etching gas to etch the silicon nitride layer selectively. Additionally, at a time of dry etching the silicon nitride layer, etching gas such as mono-fluoromethane ($CH_3F$) or di-fluoromethane ($CH_2F_2$) and the like containing hydrogen is rarely used since a thick polymer film is formed by oxygen radicals when etching gas is plasmatized. The thick polymer film deteriorates the etch rate of the silicon nitride film.

Currently, the ONO stack has an increasing number of layers, e.g., 200 to 300 layers. In the ONO stack, the silicon nitride layers adjacent to the substrate (i.e., the nitride layers at the lower end of the ONO stack) has a low etch rate, while the silicon nitride layers adjacent to the surface of the ONO stack (i.e., the nitride layers at the upper end of the ONO stack) are rapidly etched. Additionally, while the silicon nitride layer is selectively etched, a portion of the silicon oxide layer is lost or the silicon oxide layer becomes thin, causing damage to the silicon oxide layer.

SUMMARY

The objective of the present disclosure is to provide a method of processing a substrate that helps to reduce or suppress damage to a silicon oxide layer at a time when a silicon nitride layer is selectively etched in an ONO stack.

The objective of the present disclosure is to provide a method of processing a substrate in which the etch profile of an ONO stack is adjusted.

In an embodiment of the present disclosure, a method of processing a substrate comprising an ONO stack in which a silicon oxide layer and a silicon nitride layer are stacked alternately and repeatedly on the substrate comprises: (a) primarily dry-etching silicon nitride layers of the ONO stack; (b) producing oxygen radicals and processing silicon oxide layers of the ONO stack with the oxygen radicals; and (c) secondarily dry-etching the silicon nitride layers of the ONO stack.

As described above, the method of processing a substrate according to the present disclosure comprises oxygen radical processing between the primary dry etching and the secondary dry etching. That is, the method according to the present disclosure involves processing a substrate with oxygen radicals after the primary etching step, rather than proceeding with the secondary etching step immediately after the primary etching step, to passivate the oxide layers of the ONO stack. Thus, damage to the oxide layers of the ONO stack can be reduced or suppressed.

The oxygen radicals may be produced from one or more sources selected from $O_2$, $O_3$, $N_2O$, NO, $N_2O_2$ and $H_2O$.

Additionally, step (b) may comprise using oxygen radicals produced in a remote plasma system.

In steps (a) and (c), while a plurality of gasses is plasmatized to etch the silicon nitride layer, the plurality of gases may comprise a first gas containing fluorine except for nitrogen trifluroride ($NF_3$) and a second gas containing hydrogen.

Further, an atomic ratio of fluorine to hydrogen (F:H) included in the plurality of gases may be 15:1 or greater and less than 22.5:1. In another example, the atomic ratio of fluorine to hydrogen (F:H) included in the plurality of gases may be 22.5:1 or greater and 35:1 or less.

To plasmatize the plurality of gases, high-frequency power having RF frequencies of 15 MHz or greater and less than 60 MHz may be used.

In another embodiment of the present disclosure, a method of processing a substrate com comprising an ONO stack in which a silicon oxide layer and a silicon nitride layer are stacked alternately and repeatedly on the substrate comprises: (a) dry-etching silicon nitride layers of the ONO stack m (a natural number greater than or equal to 2) times; and (b) dry-etching silicon nitride layers of the ONO stack n (a natural number greater than or equal to 2) times, wherein steps (a) and (b) comprise one or more oxygen radical processing steps of processing silicon oxide layers of the ONO stack with oxygen radicals between dry etching and dry etching.

The oxygen radicals may be selected from $O_2$, $O_3$, $N_2O$, NO, $N_2O_2$ and $H_2O$.

The oxygen radical processing step may comprise using oxygen radicals produced in a remote plasma system.

After step (a), a substrate may be unloaded from a process chamber to clean the process chamber.

The process chamber may be cleaned with oxygen radicals.

The oxygen radicals applied for the cleaning may be produced under RF power conditions higher than those of the oxygen radicals applied in steps (a) and (b).

Further, dry etching of each of steps (a) and (b) may comprise plasmatizing a plurality of gases and etching the silicon nitride layers, and the plurality of gases may comprise a first gas containing fluorine except for nitrogen trifluroride ($NF_3$) and a second gas containing hydrogen.

Further, an atomic ratio of fluorine to hydrogen (F:H) included in the plurality of gases may be 15:1 or greater and less than 22.5:1. In another example, the atomic ratio of fluorine to hydrogen (F:H) included in the plurality of gases may be 22.5:1 or greater and 35:1 or less.

To plasmatize the plurality of gases, high-frequency power having RF frequencies of 15 MHz or greater and less than 60 MHz may be used.

In a method of processing a substrate according to the present disclosure, an oxygen radical processing step is included between a primary dry etching step and a secondary dry etching step. That is, the method according to the present disclosure involves processing a substrate with oxygen radicals after the primary etching step rather than proceeding with the secondary etching step immediately after the primary etching step, to produce the passivation effect on oxide layers. Thus, at a time of dry etching of a following nitride layer, damage to an oxide layer can be reduced or suppressed, since the surfaces of silicon layers are thermodynamically stable as the oxygen radicals are applied.

Additionally, in the method of processing a substrate, a portion of the entire etching cycle proceeds, and then the substrate is unloaded from a process chamber to clean the inside of the process chamber. As the process chamber is cleaned with oxygen radicals, fluorine accumulated on the wall of the process chamber can be removed.

Further, in the method of processing a substrate, the atomic ratio of fluorine to hydrogen included in a plurality of gases for etching the nitride layer of an ONO stack selectively can be controlled such that the etch profile of the ONO stack is controlled.

BRIEF DESCRIPTION OF DRAWINGS

The accompanying drawings constitute a part of the specification, illustrate one or more embodiments in the disclosure, and together with the specification, explain the disclosure, wherein.

DETAILED DESCRIPTION

Advantages and features in the present disclosure and methods of ensuring the same can be clearly understood from embodiments that are described with reference to the accompanying drawings. The subject matter of the present disclosure, however, can be embodied in various different forms, and should not be construed as being limited to the embodiments set forth herein.

Hereafter, a method of processing a substrate in a preferred embodiment is described with reference to the accompanying drawings.

Figure 1:
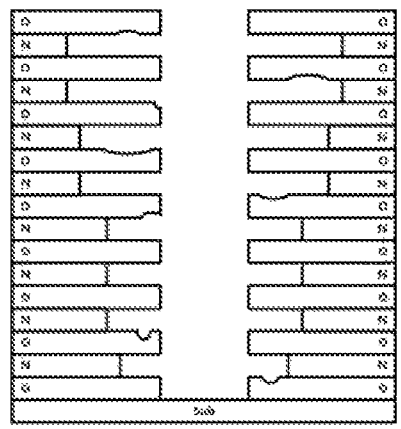
FIG. 1 shows results of the etching of a silicon nitride layer without an oxygen radical processing step.
Figure 2:
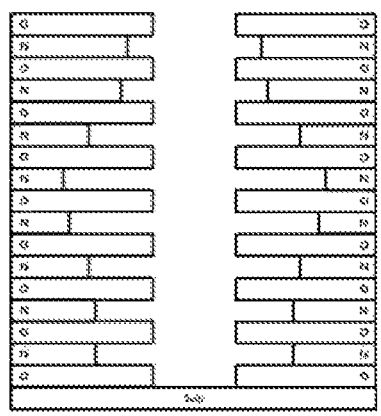
FIGS. 2 and 3 show results of the etching of a silicon nitride layer with an oxygen radical processing step that is performed among etching steps.
Figure 3:
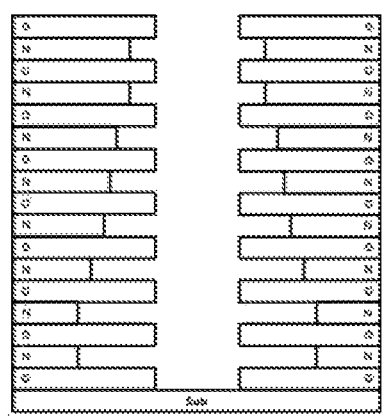

The method of processing a substrate according to the present disclosure is carried out in a process chamber in which a substrate is loaded on a susceptor. An ONO (Oxide-Nitride-Oxide) stack where a silicon oxide layer and a silicon nitride layer are stacked alternately is formed on the substrate. The ONO stack, for example, may have a structure in which silicon oxide layers and silicon nitride layers are stacked a few times, tens of times, or even hundreds of time. As a result, the ONO stack may have a structure where silicon oxide layers and silicon nitride layers are stacked in 200 to 300 layers. For example, the ONO stack may be comprised of 9 layers of silicon oxide layers and 8 layers of silicon nitride layers, as illustrated in FIGS. 1 to 3.

According to the present disclosure, the method of processing a substrate on which the ONO stack is formed comprises including an oxygen radical applying step between a primary etching step and a secondary etching step while comprising the primary etching step and the secondary etching step. That is, in the present disclosure, the method of processing a substrate involves performing the oxygen radical processing step after the primary etching step, and then performing the secondary etching step, rather than proceeding with the secondary etching step immediately after the primary etching step.

Specifically, the method of processing a substrate according to the present disclosure comprises a dry etching step of the silicon nitride layers of the ONO stack, which is performed m (a natural number greater than or equal to 2) times, and a dry etching step of the silicon nitride layers of the ONO stack, which is performed n (a natural number greater than or equal to 2) times, and an oxygen radical processing step between any one dry etching step and the following dry etching step thereof included in the dry etching steps that are performed m times, and/or any one dry etching step and the following dry etching step thereof included in the dry etching steps that are performed n times, and/or the last dry etching step of the dry etching steps performed m times and the first dry etching step of the dry etching steps performed n times.

Since the oxygen radical processing step is performed before a following etching step as described above, a passivation effect may be produced on the oxide layers. Thus, in the following etching step, damage to the oxide layers may decrease. This is because the oxygen radical processing step helps to ensure the thermodynamic stability of the surface of the silicon layers of the ONO stack.

In one example, oxygen radicals may be produced typically from $O_2$ source. In another example, oxygen radicals may be produced from another source including an oxygen atom, e.g., a source selected from $O_3$, $N_2O$, NO, $N_2O_2$ and $H_2O$.

In the oxygen radical processing step, oxygen radicals that are produced, based on the plasmatization of a source including an oxygen atom such as $O_2$ in the process chamber where an etching step is performed, may be used. Preferably, oxygen radicals, produced in a remote plasma system, may be used in the oxygen radical processing step. The oxygen radicals produced in the remote plasma system are advantageous over the other oxygen radicals because the conditions for generating plasma, such as RF power and the like, in the process chamber where etching is performed, do not need to be changed.

The conditions for producing oxygen radicals from oxygen in the process chamber or the remote plasma system involve 15 to 50 MHz of RF frequencies, 500 to 2500 W of RF power, and a capacitively coupled plasma (CCP) mode of RF conditions. Additionally, 1000 to 3000 sccm of oxygen ($O_2$) gases may be supplied and used as a reactive gas, and 50 to 1000 sccm of argon gas may be used with the $O_2$ gas.

An oxygen radical processing period may be 10 to 120 seconds. Additionally, during the oxygen radical processing step, processing pressure of 0.3 to 10 Torr, susceptor surface temperature of 0 to 50° C., and the like may be applied but not limited. A variety of publicly-known processing conditions may be applied.

The primary and secondary etching steps and the oxygen radical processing step may be carried out based on an in-situ method. The substrate where the silicon oxide layers and the silicon nitride layers are alternately stacked is loaded in the process chamber, and for etching to be performed up to a desired depth in the horizontal and/or perpendicular direction, a cyclic etching (e.g., 60 cycles) is performed on the silicon nitride layers, and then the substrate is unloaded from the process chamber.

Herein, the cyclic etching comprises the oxygen radical processing step in the middle of the etching steps. The oxygen radical processing step may be included among all the etching steps. In another example, the oxygen radical processing step may be performed once per a plurality of etching steps. For example, etching 1—oxygen radical processing—etching 2 oxygen radical processing—etching 3—oxygen radical processing—etching 4— . . . may be performed consecutively. In another example, etching 1, etching 2, etching 3—oxygen radical processing—etching 4, etching 5, etching 6—oxygen radical processing—etching 7, etching 8, etching 9 . . . may be performed consecutively.

In another example, the primary and secondary etching steps and the oxygen radical processing step may be carried out based on an ex-situ method. In the ex-situ method, the substrate is unloaded from the process chamber after the primary etching step, and the process chamber is cleaned. The secondary etching step may be performed in the process chamber where the primary etching step is carried out or in an additional process chamber.

Regarding the ex-situ method, a first substrate is loaded in the process chamber, the nitride layers experience the cyclic etching (e.g., 20 cycles) that includes the oxygen radical processing step in the middle of the etching steps, up to a predetermined depth, and then the substrate is unloaded from the process chamber where the primary etching step is performed, moved to the atmospheric state (a load lock process chamber or a load port), and exposed to the atmosphere. Along the way, the process chamber is cleaned with oxygen radicals to remove fluorine accumulated on the wall of the process chamber. Then a second substrate is inserted into the process chamber instead of inserting the first substrate again in the process chamber, and experiences cyclic etching up to a predetermined depth. Accordingly a desired number of substrates (e.g., 25 wafers) is processed consecutively as many times as you want (e.g., 3 times*20=60 cycles).

In the cleaning step, where fluorine remaining on the inner wall of the process chamber is removed in the state where the first substrate is unloaded, nitrogen plasma is ordinarily used. However, in the present disclosure, oxygen radicals ensuring high efficiency of removing fluorine are used to remove fluorine remaining on the inner wall of the process chamber, considering that fluorine remains as a carbon polymer in the process chamber.

Regarding the in-situ method, fluorine on the wall of the process chamber may fall down in the form of a particle. The ex-situ method may not cause such a problem. Unlike the in-situ method, the ex-situ method has the advantage of maintaining an initial processing atmosphere as well as cleaning, i.e., removing fluorine accumulated in the process chamber, since the temperature of the substrate and the atmosphere inside the process chamber after the cleaning step remain the substantially same as the temperature of the substrate and the atmosphere inside the process chamber in etching step while the substrate is exposed to the atmosphere and is on standby after the etching step. Additionally, regarding the ex-situ method, while the substrate is unloaded from the process chamber and exposed to the atmosphere, the substrate reacts with oxygen included in the air, producing a greater passivation effect.

In conclusion, the ex-situ method, as described above, is advantageous over the in-situ method despite its throughput loss.

Further, the conditions for producing oxygen radicals in the middle of an etching cycle, in the state where the substrate is loaded, and the conditions for oxygen radical processing for cleaning the process chamber in the state where the substrate is unloaded differ. At a time of oxygen radical processing in the middle of the etching cycle, RF power for producing oxygen radicals is controlled to a high level such that the passivation effect is sufficiently exerted to the inside of a pattern, and at a time of oxygen radical processing for cleaning the process chamber, a period for which the radicals are processed is relatively long, and RF power is controlled to a relatively low level to reduce plasma damage to the components of the process chamber and completely remove remaining fluorine.

The method of processing a substrate according to the present disclosure involves supplying a plurality of gases into the process chamber, in the primary etching step and the secondary etching step, to selectively etch the silicon nitride layers. Hereafter, the primary etching step and the secondary etching step are described specifically.

In the present disclosure, to selectively etch the silicon nitride layer, a plurality of gases is supplied into the process chamber. The plurality of gases comprises a first gas containing fluorine (F) and a second gas containing hydrogen (H).

Additionally, it is preferable to exclude nitrogen trifloride ($NF_3$) from the first gas, in the present disclosure. Since the component of nitrogen trifloride ($NF_3$) etches the silicon oxide layer to some degree as well as the silicon nitride layer, it is preferable to exclude nitrogen trifloride ($NF_3$) from the plurality of gases for etching the silicon nitride layer selectively.

In the present disclosure, the first gas and the second gas are plasmatized in the process chamber, e.g., a shower head.

The processing conditions for plasma etching involve supplying high-frequency power having RF frequencies of 15 MHz or greater and less than 60 MHz to the shower head from an RF power source of an etching device. Preferably, RF frequencies range from 15 to 50 MHz. In the case of RF frequency of 13.56 MHz less than 15 MHz, the efficiency of plasmatization and decomposition of the plurality of gases is low, and accordingly, most of the etching radicals are consumed on the silicon nitride layers in the upper side of the ONO stack. Thus, at an RF frequency of less than 15 MHz, the silicon nitride layers in the lower side of the ONO stack are not etched properly, and damage such as pattern collapse may be caused due to the excessive etching of the silicon nitride layers in the upper side of the ONO stack. To prevent this from happening, RF frequencies of 15 MHz or greater are preferred. Further, at RF frequencies of 60 MHz and 67.8 MHz greater than or equal to 60 MHz, excessive efficiency of ionization and decomposition may make it difficult to obtain a desired etch profile, despite of the adjustment of other processing conditions.

Further, out of an inductively coupled plasma (ICP) mode or a capacitively coupled plasma (CCP) mode, the CCP mode is preferred as a plasma mode in the present disclosure. The CCP mode ensures more excellent uniformity than the ICP mode. Accordingly, the CCP mode helps to produce uniform processing results of a device in processing a large number of substrates.

The processing conditions for plasma etching further involve RF power of 700 to 2500 W, processing pressure of 0.3 to 10 Torr, susceptor surface temperature of 0 to 50° C., and the like, but are not limited. A variety of well-known processing conditions may be applied.

The atomic ratio of fluorine and hydrogen (F:H) included in the plurality of gases is 15:1 to 35:1, preferably. The atomic ratio of fluorine and hydrogen (F:H) may be achieved based on the control of the flow rate of fluorine-containing gas and hydrogen-containing gas.

In the case of atomic ratio of fluorine and hydrogen (F:H) that is less than 15:1, an excessive amount of hydrogen is present, and a polymer film derived from plasma is formed on the surfaces of the silicon oxide layers and the silicon nitride layers thickly. Thus, the etch rate of the silicon nitride layers may decrease significantly. In the case of atomic ratio of fluorine and hydrogen (F:H) that is greater than 35:1, a polymer film is very thin due to the shortage of hydrogen. Thus, the etch rate of the silicon oxide layers increases, imposing damage to a pattern.

The first gas may be carbon tetrafluoride ($CF_4$). The second gas may be one or more selected from difluoromethane ($CH_2F_2$), monofluoromethane ($CH_3F$), methane ($CH_4$), hydrogen ($H_2$), ammonia ($NH_3$), and trifluoromethane ($CHF_3$). Preferably, the first gas is carbon tetrafluoride ($CF_4$), and the second gas is difluoromethane ($CH_2F_2$). While the flow rate of the first gas may be set to 800 sccm or less, the flow rate of the second gas may be set to 200 sccm or less, but not limited.

Further, the plurality of gases may further comprise nitrogen and oxygen. The nitrogen is coupled with oxygen to form nitric oxide (NO) such that contributes to the etching of the silicon nitride layer. The component oxygen contributes to the removal of processing byproducts. For example, nitrogen may be supplied into the process chamber at a flow rate of 2000 sccm or less, and oxygen may be supplied into the process chamber at a flow rate of 3000 sccm or less.

After the selective etching of the silicon nitride layer, thermal processing may be performed to remove a condensed film formed on the surface of the silicon nitride layer, in the etching process. The thermal processing may be performed within a temperature range of 80 to 300° C.

Effect of Oxygen Radical Application

FIG. 1 shows results of the etching of a silicon nitride layer without oxygen radical processing. In FIGS. 1 to 3, Sub indicates a silicon substrate, O indicates a silicon oxide layer, and N indicates a silicon nitride layer.

FIG. 1 shows an example of etching at an etch rate that gradually decreases from an uppermost silicon nitride layer toward a lowermost silicon nitride layer. Referring to FIG. 1, while the uppermost silicon nitride layer is etched rapidly, the lowermost silicon nitride layer is etched most slowly. Additionally, FIG. 1 shows that the silicon oxide layer is damaged undesirably.

FIGS. 2 and 3 show results of the etching of the silicon nitride layer with an oxygen radical processing step that is performed among etching steps.

FIG. 2 shows examples of etching at an etch rate that gradually increases from the uppermost silicon nitride layer toward a mid-portion silicon nitride layer in the thicknesswise direction and etching at an etch rate that gradually decreases from the mid-portion silicon nitride layer in the thicknesswise direction toward the lower most silicon nitride layer. While the mid-portion silicon nitride layer is rapidly etched, the lowermost silicon nitride layer is etched relatively slowly, and the uppermost silicon nitride layer is etched most slowly.

FIG. 3 shows results of etching at an etch rate that gradually increases from the uppermost silicon nitride layer toward the lowermost silicon nitride layer. While the lowermost silicon nitride layer is rapidly etched, the uppermost silicon nitride layer is etched most slowly.

Additionally, referring to FIGS. 2 and 3, there is almost no undesirable damage to the silicon oxide layer.

Figure 4:
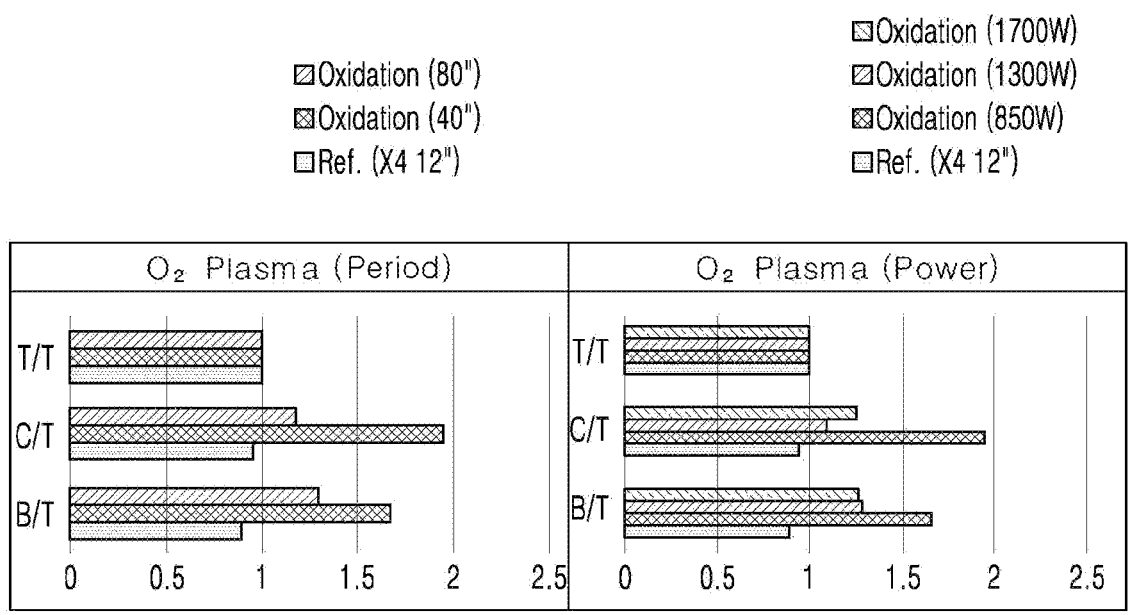
FIG. 4 shows depths of an uppermost silicon nitride layer, a mid-portion silicon nitride layer and a lowermost silicon nitride layer relative to a depth of the etching of the uppermost silicon nitride layer, depending on an oxygen radical processing period and power.

FIG. 4 shows a depth T of the etching of the uppermost silicon nitride layer, a depth C of the etching of the mid-portion silicon nitride layer and a depth B of the etching of the lowermost silicon nitride layer relative to the depth T of the etching of the uppermost silicon nitride layer, based on an oxygen radical processing period and power. The etching step was performed for 12 seconds in one cycle, and a total of four etching steps (X4 12") was performed.

Referring to the left side of FIG. 4, when 40-second (40") oxygen radical processing was included between etching and etching, the mid-portion silicon nitride layer was etched rapidly, compared to a reference (Ref.) including no oxygen radical processing, and when 80-second (80") oxygen radical processing was included between etching and etching, the lowermost silicon nitride layer was rapidly etched.

Referring to the right side of FIG. 4, the depths of the etching of the mid-portion silicon nitride layer and the lowermost silicon nitride layer are relatively deep due to oxygen radical processing of power 1700 W.

Further, table 1 shows the uniformity, thermal oxide layer etch selectivity and etch rate without oxygen radical processing and with 40-second oxygen radical processing of a non-patterned wafer.

TABLE 1

| | Results of NPW process | |
|---|---|---|
| | Ref. | Oxidation (40") |
| Uniformity | 4.3% | 4.3% |
| Selectivity (Tox) | 20.6 | 33.6 |
| Etch Rate (Å/s) | 7.5 | 7.2 |

Referring to table 1, there is no big difference in the uniformity and the etch rate. However, there is a significant difference in the selectivity of the oxide layer, and this results from the oxygen radical processing step included in the middle of the etching steps.

In the present disclosure, etching gas comprises gas containing hydrogen and gas containing fluorine, and an etch profile is adjusted based on the adjustment of the atomic ratio of fluorine to hydrogen. Additionally, in the present disclosure, the etch profile is adjusted based on the oxygen radical processing step performed among the etching steps, and the passivation effect is produced on the silicon oxide layer.

Etch Profile Control of ONO Stack

Tetrafluoromethane ($CF_4$) and difluoromethane ($CH_2F_2$) were used as etching gas for selectively etching the silicon nitride layer in the ONO stack, and the flow rate of the gases was controlled to ensure the atomic ratios of fluorine to hydrogen (F:H) shown in table 2 hereafter. In addition, the following conditions were applied.

RF frequency of RF power: 27.12 MHz
RF power of RF power source: 1000 W
Plasma mode: CCP mode
Pressure in chamber: 1 Torr
Surface temperature of susceptor: room temperature Table 2 shows an SiN etch rate, an $SiO_2$ etch rate and a T/B ratio indicating the etch rate of the uppermost silicon nitride layer to the lowermost silicon nitride layer, depending on the atomic ratio of fluorine to hydrogen (F:H).

In table 2, the SiN etch rate and the $SiO_2$ etch rate are values obtained from results of non-patterned wafer processing.

Additionally, the T/B ratio indicates an etch rate of the uppermost silicon nitride layer to the lowermost silicon nitride layer. In the case of a T/B ratio of 1, the etch rates of the lowermost silicon nitride layer and the uppermost silicon nitride layer are the same. In the case of a T/B ratio greater than 1, the uppermost silicon nitride layer is etched further than the lowermost silicon nitride layer. In the case of a T/B ratio less than 1, the lowermost silicon nitride layer is etched further than the uppermost silicon nitride layer.

TABLE 2

| F:H (Atomic ratio) | Average SiN Etch rate (Å/s) | Average SiO2 Etch rate (Å/s) | T/B ratio |
|---|---|---|---|
| 12:1 | Lowermost SIN layer non-etched | | ∞ |
| 15:1 | 4.0 | 0.04 | 2.6 |
| 18:1 | 4.1 | 0.04 | 2.3 |
| 22.5:1 | 4.2 | 0.04 | 1.0 |
| 25:1 | 4.2 | 0.04 | 0.75 |
| 30:1 | 4.3 | 0.04 | 0.55 |
| 35:1 | 4.4 | 0.05 | 0.75 |
| 38:1 | Pattern collapsed | | 0.9 |

Referring to table 2, when the atomic ratio of fluorine to hydrogen (F:H) does not reach 15:1, the lowermost silicon nitride layer is almost not etched. when the atomic ratio of fluorine to hydrogen (F:H) does not reach 15:1, it means that the ratio of hydrogen is higher than that in the other examples. As the ratio of hydrogen is high, a polymer film derived from plasma is formed thickly on the surfaces of the silicon oxide layer and the silicon nitride layer at a time of plasma etching. Accordingly, the silicon nitride layer is almost not etched. Preferably, the atomic ratio of fluorine and hydrogen (F:H) is 15:1 or greater.

Referring to table 1, when the atomic ratio of fluorine to hydrogen (F:H) is greater than 35:1, a pattern is collapsed. When the ratio of hydrogen is very low, a polymer film is formed thinly on the surfaces of the silicon oxide layer and the silicon nitride layer. Accordingly, the etch amount of the silicon oxide layer increases significantly, and a pattern is collapsed. Preferably, the atomic ratio of fluorine to hydrogen (F:H) is 35:1 or less.

Figure 5:
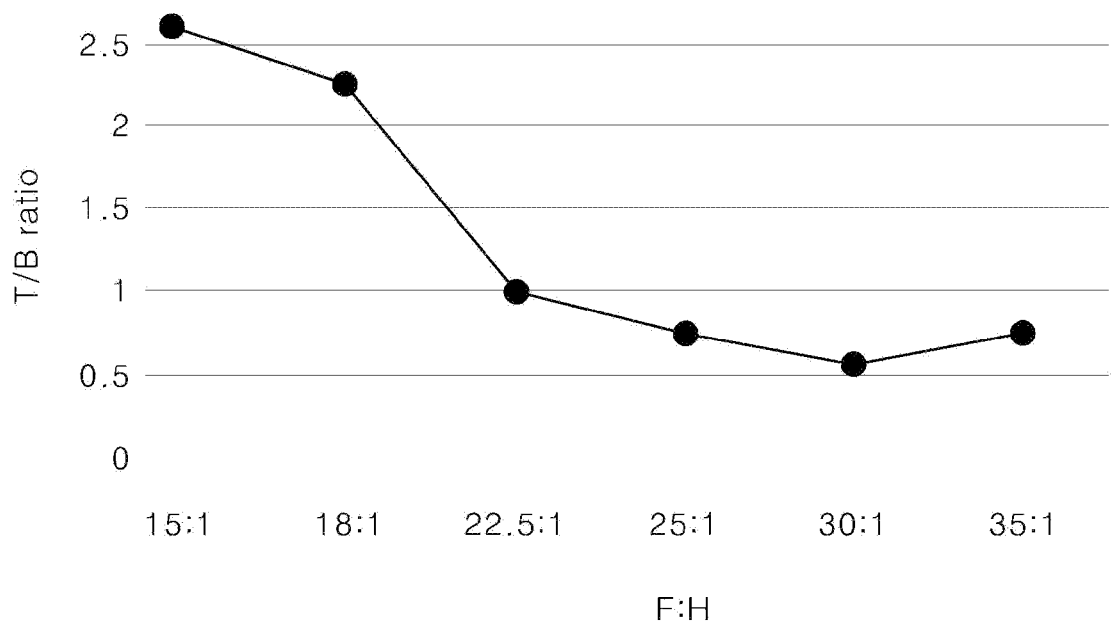
FIG. 5 shows a relative etch rate of an uppermost silicon nitride layer and a lowermost silicon nitride layer of an ONO stack, depending on an atomic ratio of fluorine to hydrogen included in etching gas.

FIG. 5 shows a relative etch rate of the uppermost silicon nitride layer and the lowermost silicon nitride layer of the ONO stack, depending on the atomic ratio of fluorine to hydrogen included in the etching gas.

Referring to table 2 and FIG. 5, in the case of an atomic ratio of fluorine to hydrogen (F:H) that is 15:1, the T/B ratio indicating the etch rate of the uppermost silicon nitride layer to the lowermost silicon nitride layer is about 2.6, and in the case of an atomic ratio of fluorine to hydrogen (F:H) that is 18:1, the T/B ratio is about 2.3. This indicates that the T/B ratios more than 1.0 are helpful when the etch rate needs to gradually decrease toward the lowermost silicon nitride layer.

Further, in the case of an atomic ratio of fluorine to hydrogen (F:H) that is 22.5:1, the T/B ratio is about 1.0. This indicates that the generally uniform T/B ratio is helpful when the etch rate needs to be uniform in the uppermost silicon nitride layer and the lowermost silicon nitride layer.

Further, in the case of an atomic ratio of fluorine to hydrogen (F:H) that are 25:1, 30:1, 35:1, the T/B ratio is less than 1.0. This indicates that the T/B ratio less than 1.0 is helpful when the etch rate needs to gradually increase toward the lowermost silicon nitride layer.

Furthermore, until the atomic ratio of fluorine to hydrogen (F:H) increases from 22.5:1 to 30:1, the T/B ratio becomes low, but as the atomic ratio of fluorine to hydrogen (F:H) increases from 30:1 to 35:1, the T/B ratio increases on the contrary.

As described above, in the method of processing a substrate of the present disclosure, the silicon nitride layer can be selectively etched with respect to the silicon oxide layer, and the etch profile of the silicon nitride layer formed on the substrate can be adjusted based on the control of the atomic ratio of fluorine to hydrogen included in the etching gas.

In particular, as the atomic ratio of fluorine to hydrogen (F:H) is controlled to 22.5:1 or greater and 35:1 or less, in the multiple silicon nitride layers, the etch profile may be controlled such that the etch depth is uniform from the uppermost silicon nitride layer to the lowermost silicon nitride layer or the etch depth gradually increases from the uppermost silicon nitride layer to the lowermost silicon nitride layer.

Additionally, the atomic ratio of fluorine to hydrogen (F:H) is adjusted to 15:1 to 35:1 even when the RF frequency is fixed to 50 MHZ, such that T/B ratios similar to those shown in table 2 could be obtained.

However, when the RF frequency is fixed to 60 MHZ, the profile of the silicon nitride layers in the thickness direction cannot be adjusted despite a change in the RF power and the pressure of the process recipe in various ways. This is because of excessive efficiency of ionization and decomposition at a time of plasma etching. As a result, the RF frequency is less than 60 MHz, preferably, in the method of processing a substrate of the present disclosure.

The embodiments are described above with reference to a number of illustrative embodiments thereof. However, numerous other modifications and embodiments can be devised by one skilled in the art. The modifications and embodiments within the technical scope of the present disclosure can be included in the scope of the present disclosure. Thus, the scope of the right to the present disclosure should be defined according to the appended claims.

What is claimed is:

1. A method of processing a substrate comprising an oxide-nitride-oxide stack in which a silicon oxide layer and a silicon nitride layer are stacked alternately and repeatedly on the substrate, comprising:
  (a) primarily dry-etching silicon nitride layers of the oxide-nitride-oxide stack;
  (b) producing oxygen radicals and processing silicon oxide layers of the oxide-nitride-oxide stack with the oxygen radicals after the primarily dry-etching the silicon nitride layers; and
  (c) secondarily dry-etching the silicon nitride layers of the oxide-nitride-oxide stack,
  wherein in steps (a) and (c), a plurality of gases are plasmatized to etch the silicon nitride layer, the plurality of gases including a first gas containing $CF_4$ and a second gas containing hydrogen.

2. The method of claim 1, wherein the oxygen radicals are produced from one or more sources selected from $O_2$, $O_3$, $N_2O$, NO, $N_2O_2$ and $H_2O$.

3. The method of claim 1, wherein step (b) comprises using oxygen radicals produced in a remote plasma system.

4. The method of claim 1, wherein an atomic ratio of fluorine to hydrogen (F:H) included in the plurality of gases is 15:1 or greater and less than 22.5:1.

5. The method of claim 1, wherein an atomic ratio of fluorine to hydrogen (F:H) included in the plurality of gases is 22.5:1 or greater and 35:1 or less.

6. The method of claim 1, wherein to plasmatize the plurality of gases, high-frequency power having RF frequencies of 15 MHz or greater and less than 60 MHz is used.

7. A method of processing a substrate comprising an oxide-nitride-oxide stack in which a silicon oxide layer and a silicon nitride layer are stacked alternately and repeatedly on the substrate, comprising:
(a) dry-etching silicon nitride layers of the oxide-nitride-oxide stack m times, wherein m is a natural number greater than or equal to 2; and
(b) dry-etching silicon nitride layers of the oxide-nitride-oxide stack n times, wherein n is a natural number greater than or equal to 2,
wherein step (a) includes one or more oxygen radical processing steps of processing silicon oxide layers of the oxide-nitride-oxide stack with oxygen radicals between primary dry etching and secondary dry etching of the m times,
wherein step (b) includes one or more oxygen radical processing steps of processing silicon oxide layers of the oxide-nitride-oxide stack with oxygen radicals between primary dry etching and secondary dry etching of the n times, and
wherein the dry etching of step (a) and the dry etching of step (b) include plasmatizing a plurality of gases and etching the silicon nitride layers, the plurality of gases including a first gas containing $CF_4$ and a second gas containing hydrogen.

8. The method of claim 7, wherein the oxygen radicals are produced from one or more sources selected from $O_2$, $O_3$, $N_2O$, NO, $N_2O_2$ and $H_2O$.

9. The method of claim 7, wherein the oxygen radical processing step comprises using oxygen radicals produced in a remote plasma system.

10. The method of claim 7, wherein after step (a), the substrate is unloaded from a process chamber to clean the process chamber.

11. The method of claim 10, wherein the cleaning is performed with oxygen radicals.

12. The method of claim 11, wherein the oxygen radicals applied for the cleaning are produced under RF power conditions higher than those of the oxygen radicals applied in steps (a) and (b).

13. The method of claim 7, wherein an atomic ratio of fluorine to hydrogen (F:H) included in the plurality of gases is 15:1 or greater and less than 22.5:1.

14. The method of claim 7, wherein an atomic ratio of fluorine to hydrogen (F:H) included in the plurality of gases is 22.5:1 or greater and 35:1 or less.

15. The method of claim 7, wherein high-frequency power having RF frequencies of 15 MHz or greater and less than 60 MHz is used to plasmatize the plurality of gases.

* * * * *